(12) United States Patent
Hamada et al.

(10) Patent No.: US 8,506,024 B2
(45) Date of Patent: Aug. 13, 2013

(54) ELECTRONIC APPARATUS

(71) Applicant: Kabushiki Kaisha Toshiba, Tokyo (JP)

(72) Inventors: Tomohiro Hamada, Tachikawa (JP); Toshikazu Shiroshi, Hamura (JP); Tomoko Kitamura, Ome (JP); Toshio Konno, Akiruno (JP); Kohei Wada, Tachikawa (JP); Ryosuke Saito, Koganei (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/662,226

(22) Filed: Oct. 26, 2012

(65) Prior Publication Data

US 2013/0050920 A1 Feb. 28, 2013

Related U.S. Application Data

(63) Continuation of application No. 12/882,635, filed on Sep. 15, 2010, now abandoned.

(30) Foreign Application Priority Data

Dec. 25, 2009 (JP) .................................. 2009-295633

(51) Int. Cl.
*E05D 5/00* (2006.01)
*H05K 7/00* (2006.01)
*A47B 81/00* (2006.01)
*A47B 97/00* (2006.01)

(52) U.S. Cl.
USPC ...... 312/223.2; 312/327; 16/382; 361/679.29

(58) Field of Classification Search
USPC .... 312/326–327, 223.2; 361/679.26–679.29; 16/382, 270, 271
See application file for complete search history.

(56) References Cited

U.S. PATENT DOCUMENTS 4,788,550 A * 11/1988 Chadima, Jr. .................. 343/712
5,144,721 A * 9/1992 Schade ............................ 16/237
(Continued)

FOREIGN PATENT DOCUMENTS

JP 07-293093 11/1995
JP 2000-204827 7/2000
(Continued)

OTHER PUBLICATIONS

Notification of Reasons for Rejection mailed by Japan Patent Office on Dec. 7, 2010 in the corresponding Japanese patent application No. 2009-295633 in 6 pages.
Information Sheet in 1 page.

*Primary Examiner* — Darnell Jayne
*Assistant Examiner* — Kimberley S Wright
(74) *Attorney, Agent, or Firm* — Knobbe, Martens, Olson & Bear, LLC (57) ABSTRACT

According to one embodiment, an electronic apparatus includes a first housing, a second housing, a mounting portion, and a hinge. The mounting portion is provided in the first housing. The mounting portion includes a mounting surface, a first pin protruding from the mounting surface, and a receiver including an insertion groove. The hinge is attached to the second housing and includes a fixing portion. The fixing portion includes a main portion mounted on the mounting surface, an elongated hole provided in the main portion and configured to engage with the first pin, and an inserting portion configured to be inserted into the insertion groove and supported by the receiver from a side opposite to the mounting surface.

16 Claims, 9 Drawing Sheets (56) References Cited

U.S. PATENT DOCUMENTS

| | | | | |
|---|---|---|---|---|
| 6,202,256 | B1* | 3/2001 | Bovio et al. | 16/382 |
| 6,389,643 | B1* | 5/2002 | Lim et al. | 16/271 |
| 6,774,959 | B2* | 8/2004 | Agata et al. | 349/58 |
| 7,170,759 | B2* | 1/2007 | Soga | 361/825 |
| 2003/0016489 | A1 | 1/2003 | Agata et al. | |
| 2005/0115025 | A1 | 6/2005 | Minaguchi et al. | |
| 2007/0285878 | A1 | 12/2007 | Konino et al. | |

FOREIGN PATENT DOCUMENTS

| | | |
|---|---|---|
| JP | 2001-166849 | 6/2001 |
| JP | 2002-132174 | 5/2002 |
| JP | 2003-029241 | 1/2003 |
| JP | 2003-256078 | 9/2003 |
| JP | 2005-165478 | 6/2005 |
| JP | 2007-328613 | 12/2007 |

\* cited by examiner

ELECTRONIC APPARATUS

CROSS-REFERENCE TO RELATED APPLICATIONS

This application is a continuation of U.S. patent application Ser. No. 12/882,635, filed Sep. 15, 2010, and entitled "ELECTRONIC APPARATUS," which is based upon and claims the benefit of priority from Japanese Patent Application No. 2009-295633, filed Dec. 25, 2009, the entire contents of each of which are incorporated herein by reference.

FIELD

Embodiments described herein relate generally to an electronic apparatus comprising a hinge.

BACKGROUND

Electronic apparatuses, such as notebook PCs, comprise hinges that connect a display unit to a main unit. Jpn. Pat. Appin. KOKAI Publication No. 2002-132174 discloses an electronic apparatus comprising hinges. In the electronic apparatus, an extending portion is provided in the hinge that supports the display unit. The main unit includes a hook-shaped temporary fixing portion. The extending portion of the hinge is inserted into the lower side of the temporary fixing portion, and the display unit is maintained in a rising state during screwing.

BRIEF DESCRIPTION OF THE DRAWINGS

A general architecture that implements the various feature of the embodiments will now be described with reference to the drawings. The drawings and the associated descriptions are provided to illustrate embodiments and not to limit the scope of the invention.

DETAILED DESCRIPTION

Various embodiments will be described hereinafter with reference to the accompanying drawings. In general, according to one embodiment, an electronic apparatus comprises a first housing, a second housing, a mounting portion, and a hinge. The mounting portion is provided in the first housing. The mounting portion comprises a mounting surface, a first pin protruding from the mounting surface, and a receiver including an insertion groove. The hinge is attached to the second housing and includes a fixing portion. The fixing portion comprises a main portion mounted on the mounting surface, an elongated hole provided in the main portion and configured to engage with the first pin, and an inserting portion configured to be inserted into the insertion groove and supported by the receiver from a side opposite to the mounting surface.

Hereinafter, exemplary embodiments applied to a notebook personal computer (hereinafter, referred to as a notebook PC) will be described with reference to the accompanying drawings.

First Embodiment

FIGS. 1 to 10 show an electronic apparatus 1 according to a first embodiment. The electronic apparatus 1 is, for example, a notebook PC. However, electronic apparatuses to which the embodiment can be applied are not limited thereto. The embodiment can be widely applied to various kinds of electronic apparatuses, such as a personal digital assistant (PDA) and a game machine.

Figure 1:
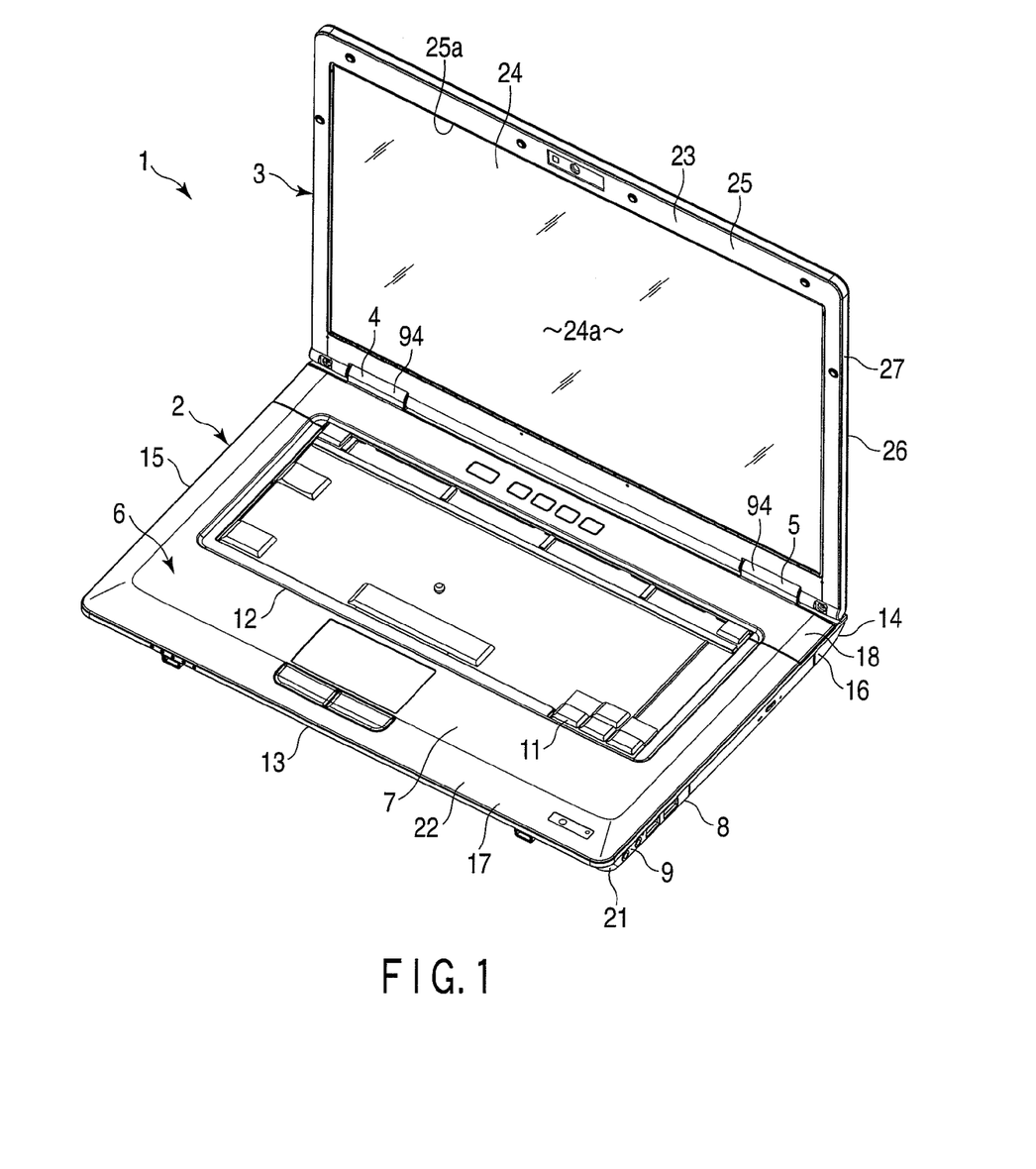
FIG. 1 is an exemplary perspective view illustrating an electronic apparatus according to a first embodiment.

As shown in FIG. 1, the electronic apparatus 1 comprises a main unit 2, a display unit 3, and first and second hinges 4 and 5. The main unit 2 is an example of a "first unit". The display unit 3 is an example of a "second unit".

The main unit 2 is an electronic apparatus main body provided with a main board. The main unit 2 comprises a main housing 6. The main housing 6 is an example of a "first housing". The main housing 6 has a flat box shape comprising an upper wall 7, a lower wall 8, and a circumferential wall 9.

The lower wall 8 faces a desk surface when the electronic apparatus 1 is placed on a desk. The lower wall 8 is substantially parallel to the desk surface. The upper wall 7 is opposite to the lower wall 8 with a space therebetween and extends substantially in parallel (that is, substantially in a horizontal direction) to the lower wall 8. A keyboard mounting portion 12 to which a keyboard 11 is attached is provided on the upper wall 7. The keyboard 1 does not include a numerical keypad, for example. Only some of the keys of the keyboard 11 are shown in FIG. 1. The circumferential wall 9 rises with respect to the lower wall 8, and connects the edge portion of the lower wall 8 and the edge portion of the upper wall 7.

As shown in FIG. 1, the circumferential wall 9 includes a front wall 13, a rear wall 14, a left wall 15, and a right wall 16. The front wall 13 extends in the left-right direction in a front end portion 17 of the main unit 2, and faces the user of the electronic apparatus 1. The rear wall 14 extends substantially in parallel to the front wall 13 in the left-right direction in a rear end portion 18 of the main unit 2.

Each of the left wall 15 and the right wall 16 extends in the front-rear direction (depth direction) of the main housing 6. The left wall 15 connects a left end portion of the front wall 13 and a left end portion of the rear wall 14. The right wall 16 connects a right end portion of the front wall 13 and a right end portion of the rear wall 14. In the specification, the side closer to the user is defined as the front side and the side away from the user is defined as the rear side. In addition, the left and right sides are defined in the user's viewing direction.

The main housing 6 comprises a main base 21 and a main cover 22. The main base 21 comprises the lower wall 8 and a part of the circumferential wall 9. The main cover 22 comprises the upper wall 7 and a part of the circumferential wall 9. The main cover 22 is combined with the main base 21 to form the main housing 6.

As described above, the main unit 2 comprises the rear end portion 18, which is a first end portion, and the front end portion 17, which is a second end portion. The display unit 3 is rotatably (openably) connected to the rear end portion 18 by, for example, the first and second hinges 4 and 5. The display unit 3 can be pivoted between a closed position where the display unit 3 falls and covers the main unit 2 from the upper side and an opened position where the display unit 3 rises with respect to the main unit 2.

As shown in FIG. 1, the display unit 3 comprises a display housing 23 and a display device 24 accommodated in the display housing 23. The display housing 23 is an example of a "second housing". The display housing 23 has a flat box shape comprising a front wall 25, a rear wall 26, and a circumferential wall 27. In the specification, the front and rear sides are defined with respect to the raised position of the display unit 3.

When the display unit 3 falls (is closed), the front wall 25 faces the upper wall 7 of the main unit 2. When the display unit 3 rises (is opened), the front wall 25 faces the user. The front wall 25 comprises a relatively large opening 25a through which a display screen 24a of the display device 24 is exposed to the outside.

The rear wall 26 is disposed opposite to the front wall 25 in the display housing 23. A space is provided between the rear wall 26 and the front wall 25, and the rear wall 26 extends substantially in parallel to the front wall 25. The circumferential wall 27 rises with respect to the rear wall 26, and connects the edge portion of the front wall 25 and the edge portion of the rear wall 26.

Next, the first and second hinges 4 and 5 will be described. The structure of the second hinge 5 is substantially the same as that of the first hinge 4. Therefore, the structure of the first hinge 4 will be described in detail as a representative example.

Figure 2:
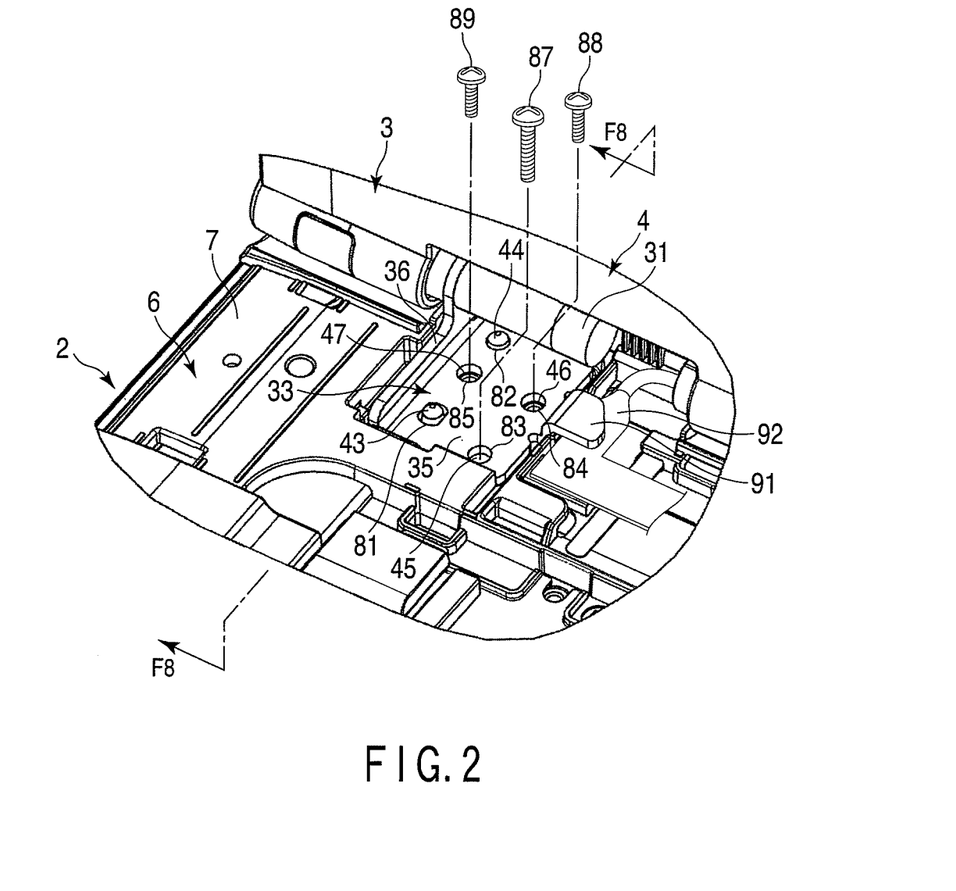
FIG. 2 is an exemplary perspective view illustrating a hinge fixing portion and a mounting portion of the electronic apparatus shown in FIG. 1.
Figure 3:
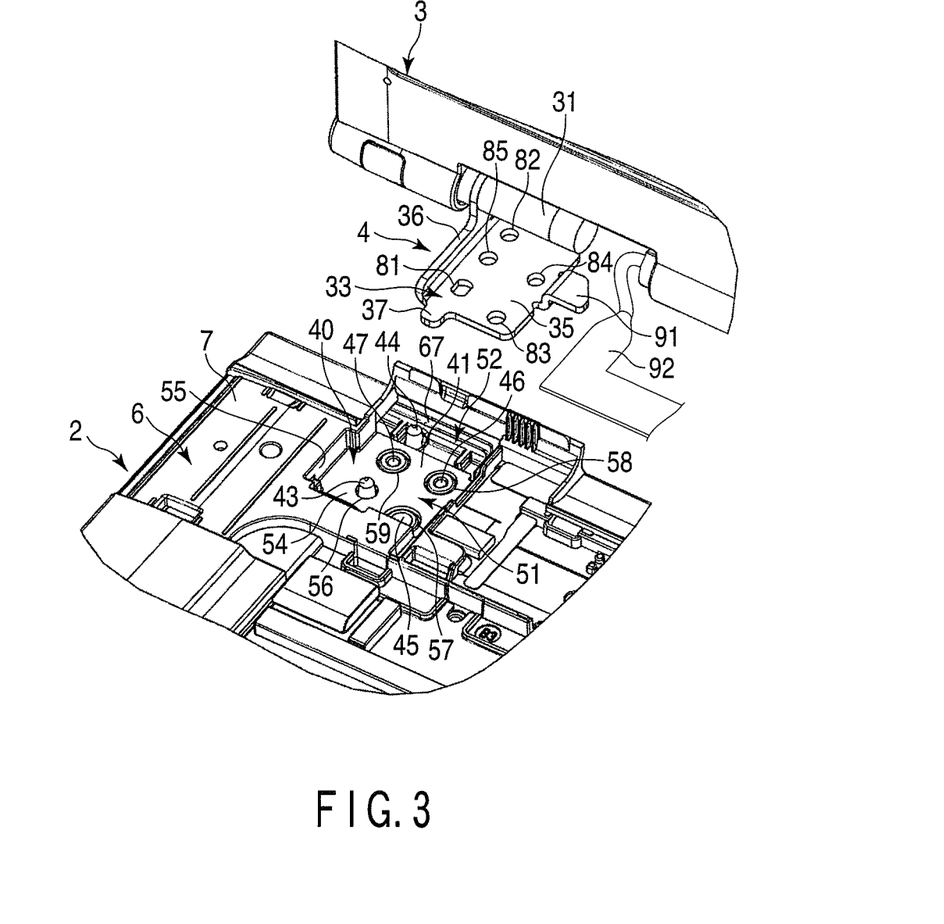
FIG. 3 is an exemplary perspective view illustrating the hinge fixing portion and the mounting portion shown in FIG. 2 which are disassembled from each other.

As shown in FIGS. 2 and 3, the first hinge 4 comprises a hinge rotating portion 31, a hinge bracket 32, and a hinge fixing portion 33. The hinge rotating portion 31 is provided between the main unit 2 and the display unit 3. The hinge rotating portion 31 comprises a hinge shaft, a cam, and a disc spring attached to the hinge shaft. The hinge rotating portion 31 connects the hinge bracket 32 and the hinge fixing portion 33 such that they can be rotated relative to each other.

Figure 4:
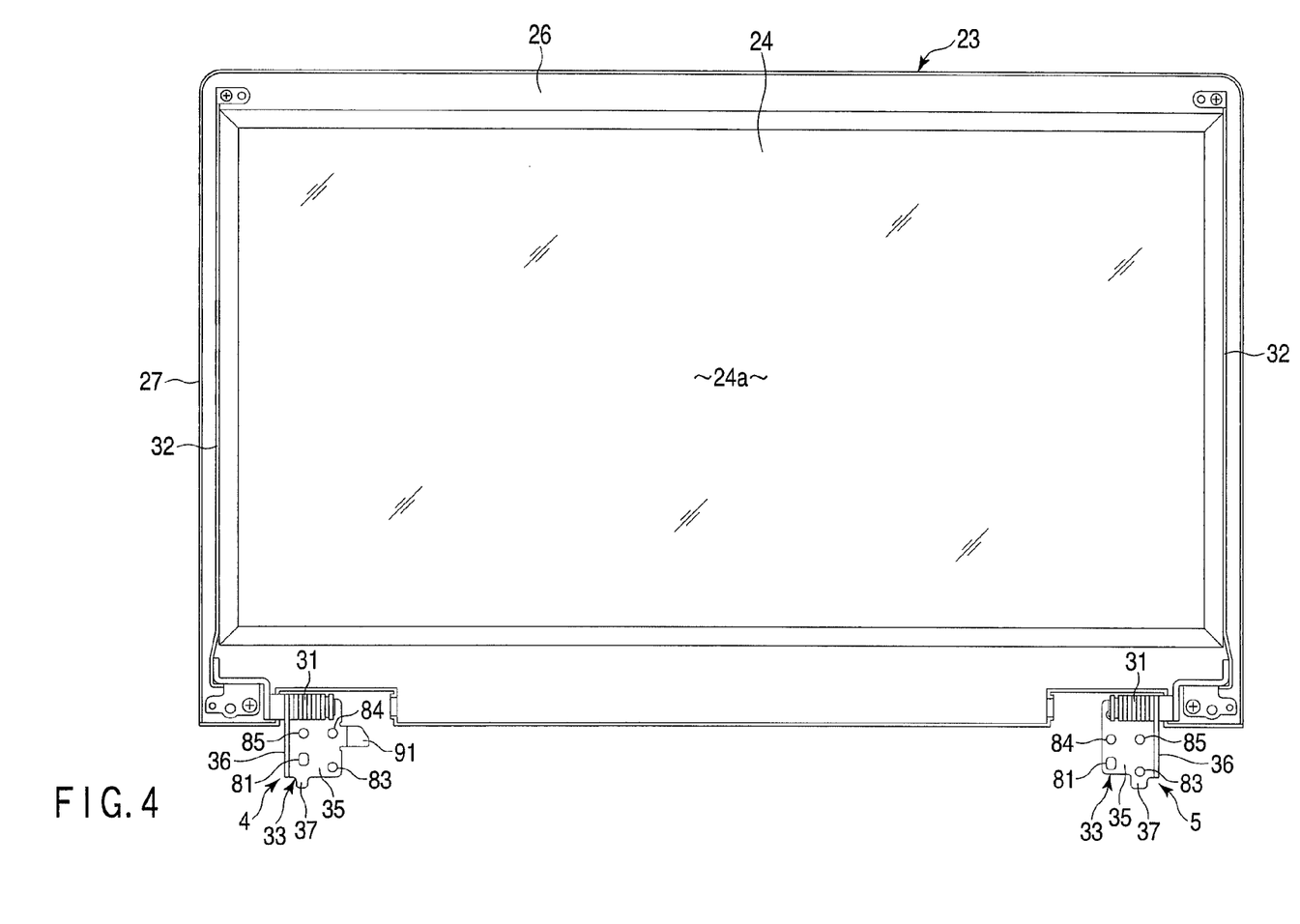
FIG. 4 is an exemplary plan view illustrating the inside of a display unit shown in FIG. 1.

As shown in FIG. 4, the hinge bracket 32 is connected to the hinge rotating portion 31 and extends into the display housing 23. The hinge bracket 32 is, for example, a metal sheet. The hinge bracket 32 extends between the side wall of the display housing 23 and the side surface of the display device 24. The hinge bracket 32 is fixed to the display housing 23 by, for example, screws. In this way, the first hinge 4 is connected to the display housing 23.

As shown in FIG. 2, the hinge fixing portion 33 fixes the first hinge 4 to the main unit 2. The hinge fixing portion 33 is an example of a "fixing portion". The hinge fixing portion 33 is connected to the hinge rotating portion 31. The hinge fixing portion 33 is a so-called hinge metal plate made of, for example, metal sheet.

As shown in FIG. 3, the hinge fixing portion 33 comprises a main portion 35, a rising portion 36, and an inserting portion 37. The main portion 35 is a horizontally flat plate. The rising portion 36 rises from the side end portion of the main portion 35 and connects the main portion 35 to the hinge rotating portion 31. The inserting portion 37 protrudes from the front end portion of the main portion 35 in the horizontal direction. The inserting portion 37 according to this embodiment protrudes in a convex shape from a part of the front end portion of the main portion 35. The insertion porting 37 may be provided in the entire front end portion of the main portion 35. For example, the insertion porting 37 has the same thickness as the main portion 35.

As shown in FIG. 3, a mounting portion 40 to which the hinge fixing portion 33 is attached is provided in the main housing 6. For example, the mounting portion 40 is formed in a concave shape in the upper wall 7. The mounting portion 40 comprises a mounting surface 41, a receiver 42, first and second pins 43 and 44, a through hole 45, and first and second screw holes 46 and 47. The mounting portion 40 is formed by a wall portion 51 of the main housing 6 made of, for example, a synthetic resin, and a metal reinforcing members 52.

Figure 5:
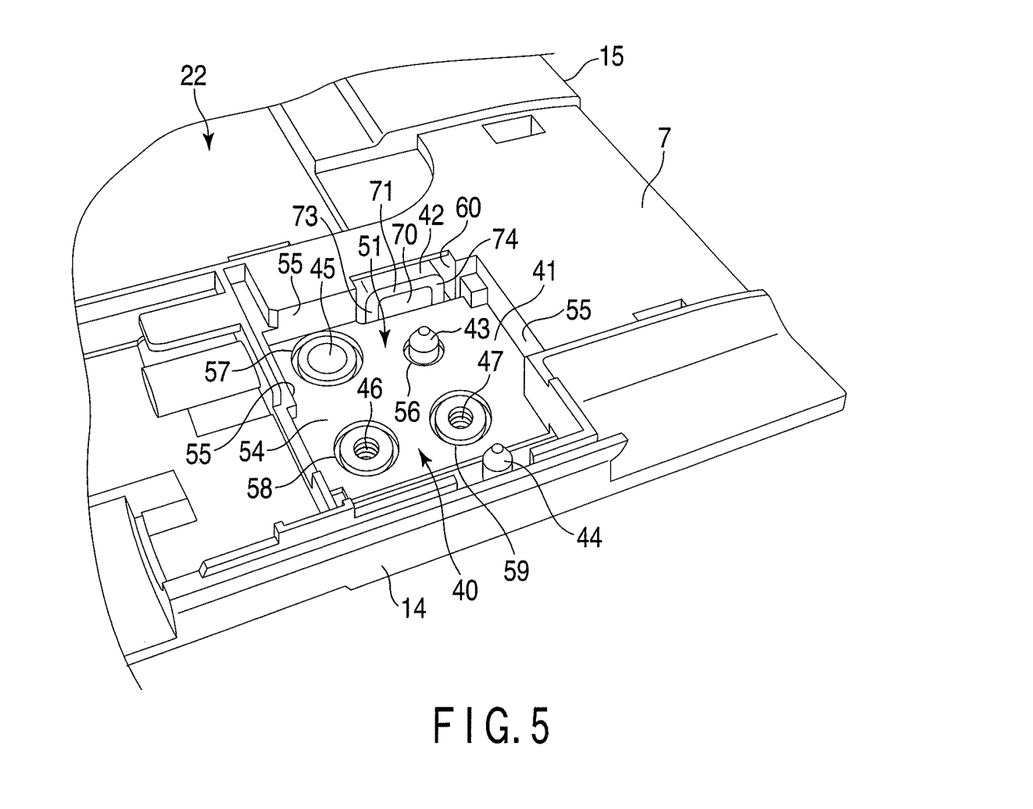
FIG. 5 is an exemplary perspective view illustrating the mounting portion shown in FIG. 3, as viewed from another angle.
Figure 8:
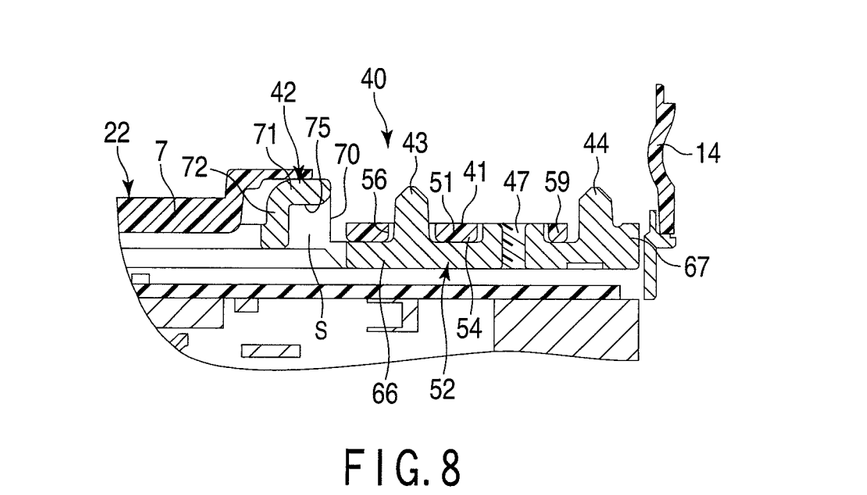
FIG. 8 is an exemplary cross-sectional view illustrating the mounting portion taken along the line F8-F8 of FIG. 2.
Figure 10:
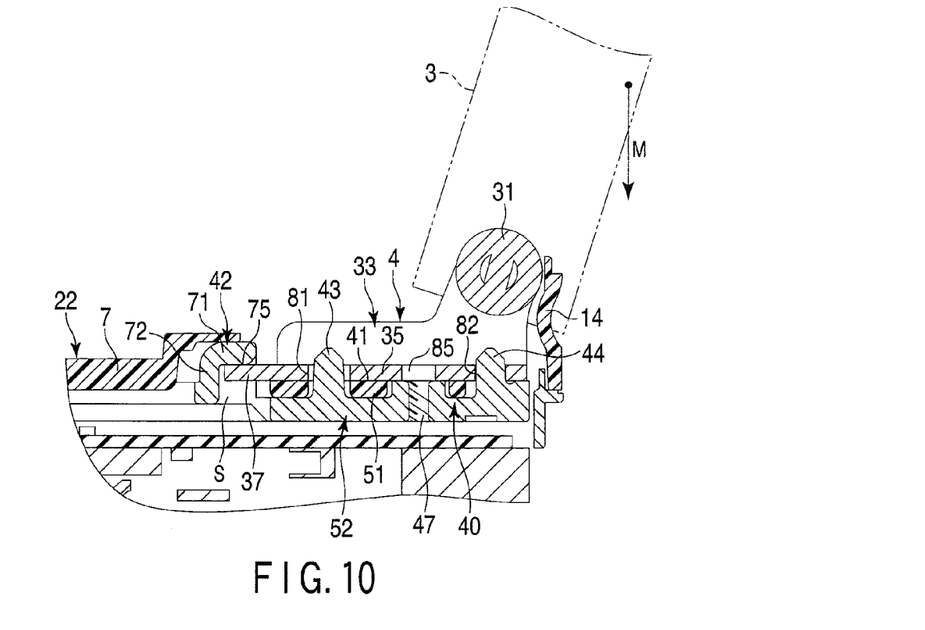
FIG. 10 is an exemplary cross-sectional view illustrating the hinge fixing portion attached to the mounting portion shown in FIG. 8.

As shown in FIG. 5, the wall portion 51 of the main housing 6 (hereinafter, simply referred to as a wall portion 51) forming the mounting portion 40 is formed integrally with the upper wall 7. As shown in FIG. 8, the wall portion 51 is positioned on the reinforcing member 52. As shown in FIG. 10, the wall portion 51 is interposed between the reinforcing member 52 and the main portion 35 of the hinge fixing portion 33.

As shown in FIGS. 5 and 8, the wall portion 51 comprises a horizontal wall portion 54 that extends in the horizontal direction at a position lower than the upper wall 7 and a rising wall portion 55 that rises from the edge portion of the horizontal wall portion 54 and is connected to the upper wall 7. The horizontal wall portion 54 according to this embodiment is provided in a region equal to or larger than half the mounting portion 40 and forms a part of the mounting surface 41. The hinge fixing portion 33 is mounted on the horizontal wall portion 54. The horizontal wall portion 54 may be provided in the entire region of the mounting portion 40 and form the entire mounting surface 41.

As shown in FIG. 5, the horizontal wall portion 54 has a substantially rectangular shape. The rising wall portion 55 rises from three edge portions, that is, the front edge portion, the left edge portion, and the right edge potion of the horizontal wall portion 54 and connects the three edge portions of the horizontal wall portion 54 to the upper wall 7. In this way, the horizontal wall portion 54 is relatively fixedly connected to the upper wall 7. The horizontal wall portion 54 comprises a through hole 56 through which the first pin 43 is exposed, a through hole 57 through which the through hole 45 is exposed, through holes 58 and 59 through which the first and second screw holes 46 and 47 are respectively exposed, and an opening 60 through which the receiver 42 is exposed.

Figure 6:
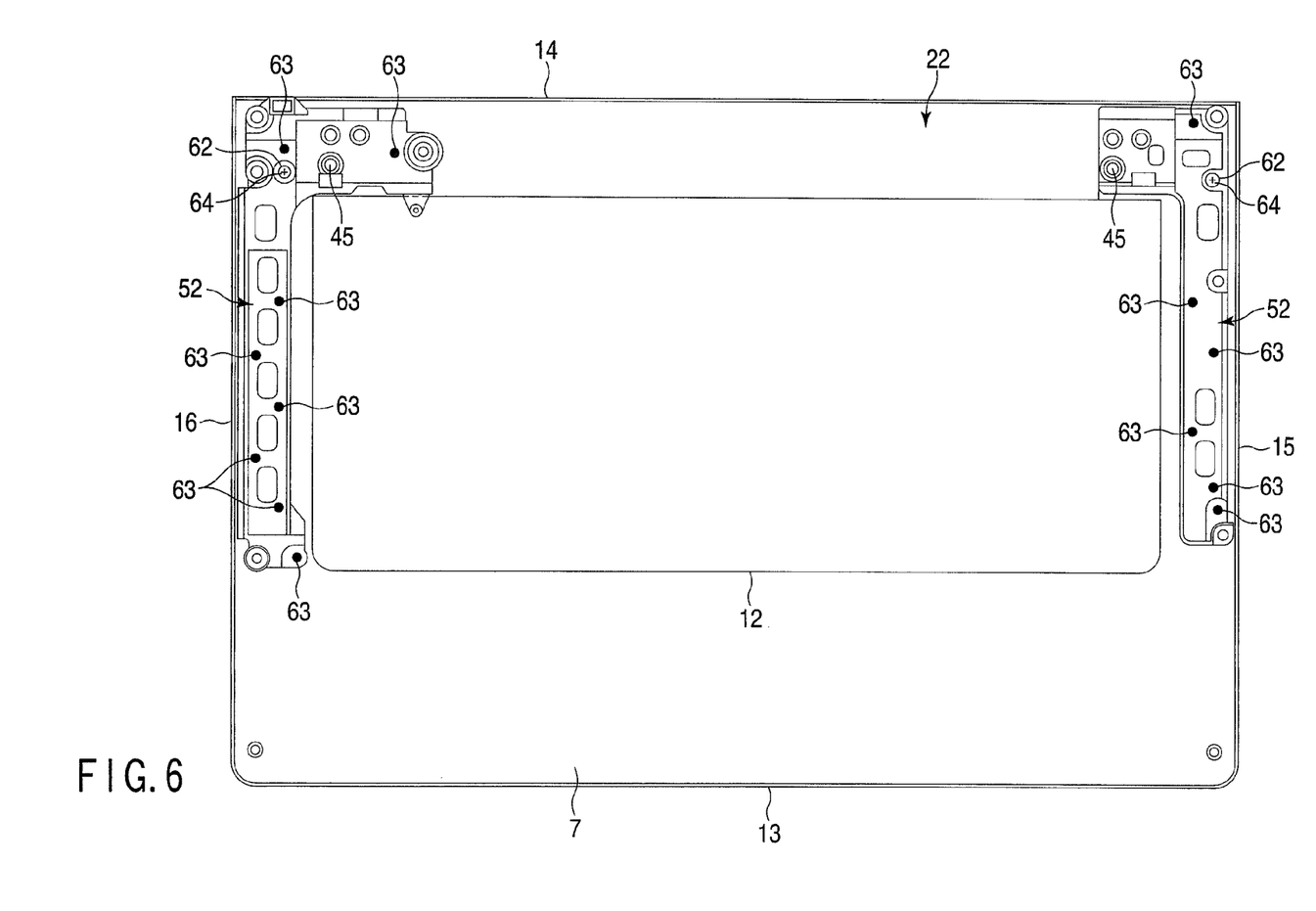
FIG. 6 is an exemplary plan view illustrating the inner surface of a main cover of the electronic apparatus shown in FIG. 1.

As shown in FIG. 6, the reinforcing members 52 are attached to the inner surface (rear surface) of the main cover 22. For example, the reinforcing members 52 are provided at the left and right end portions of the main cover 22. The reinforcing member 52 is a member corresponding to the hinge bracket (so-called hinge lower) of the main unit 2. However, the reinforcing member 52 according to this embodiment is formed so as to be disassembled from the hinge rotating portion 31 and may have a size, a shape, and a function different from those in the related art. The reinforcing member 52 is, for example, an aluminum die-cast part.

The reinforcing member 52 has relatively large width and thickness, and extends in an L shape from the lower side of the mounting portion 40 to the side of the keyboard mounting portion 12. The reinforcing member 52 is fixed to the main cover 22 by a screwing portion 62 for positioning and temporary fixation and a plurality of welding and fixing portions 63. The welding and fixing portions 63 are formed by inserting synthetic resin protrusions provided on the main cover 22 into the through holes of the reinforcing member 52 and heating, pressing and crushing the tips of the protrusions.

In this embodiment, for example, one screwing portion 62 is fixed by a screw 64 to position and temporarily fix the reinforcing member 52. In addition, the plurality of welding and fixing portions 63 (for example, three or more welding and fixing portions) arranged in the longitudinal direction of the reinforcing member 52 is welded to fix the reinforcing member 52 to the main cover 22. The reinforcing members 52 are fixed to the main cover 22 as strongly as the reinforcing members 52 are regarded to be completely integrated with the main cover 22. In this way, the main cover 22 is reinforced.

Figure 7:
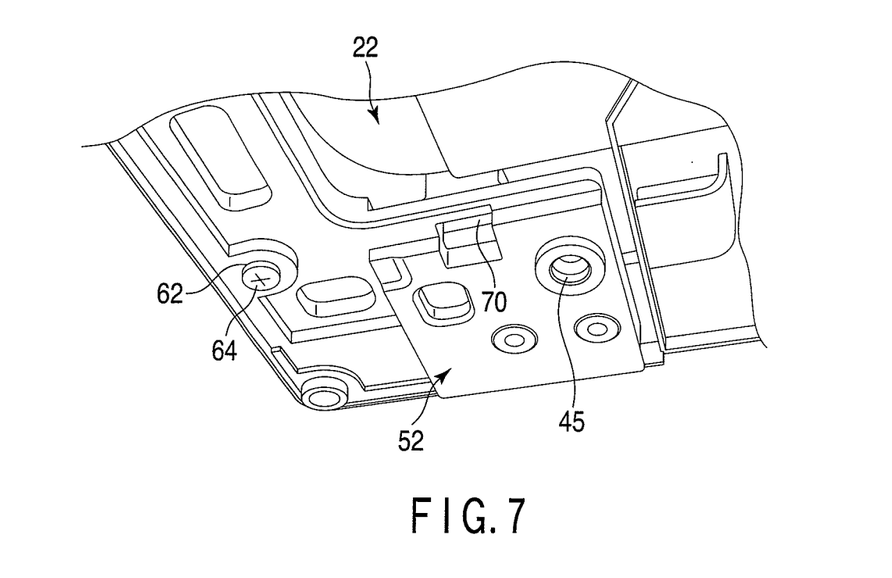
FIG. 7 is an exemplary perspective view illustrating a portion of a reinforcing member shown in FIG. 6.

As shown in FIGS. 7 and 8, the reinforcing member 52 overlaps the wall portion 51 of the main housing 6 from below and forms a part of the mounting portion 40. The reinforcing member 52 comprises a supporting portion 66 and a convex portion 67. The supporting portion 66 overlaps the wall portion 51 of the main housing 6 and supports the wall portion 51 from below. As shown in FIG. 3, the convex portion 67 is provided in a region of the mounting portion 40 deviating from the wall portion 51, that is, a region in which the wall portion 51 is not provided. The convex portion 67 protrudes from the supporting portion 66 and is substantially flush with the upper surface of the horizontal wall portion 54 of the wall portion 51. The convex portion 67 forms a part of the mounting surface 41. That is, the main portion 35 of the hinge fixing portion 33 is also provided on the convex portion 67. The convex portion 67 supports the hinge fixing portion 33 from below.

As shown in FIGS. 5 and 8, the receiver 42, the first and second pins 43 and 44, the through hole 45, and the first and second screw holes 46 and 47 are provided in the reinforcing member 52 and are made of a metal material. The receiver 42 comprises an insertion groove 70 provided between the mounting surface 41 and the receiver 42, and the inserting portion 37 of the hinge fixing portion 33 is inserted into the insertion groove 70. The receiver 42 deviates from the upper area of the mounting surface 41 and is provided on the front side of the mounting surface 41. The receiver 42 has a bowl shape with an opened lower side and an opened rear side.

The receiver 42 comprises a ceiling portion 71, a rear portion 72, and left and right portions 73 and 74. The ceiling portion 71 extends in the substantially horizontal direction. The lower surface of the ceiling portion 71 comprises a receiving surface 75 that extends in the substantially horizontal direction so as to be substantially parallel to the mounting surface 41. The gap (space) between the receiving surface 75 and the mounting surface 41 is substantially equal to the thickness of the inserting portion 37 or the main portion 35. In this way, when the main portion 35 is substantially parallel to the mounting surface 41, there is substantially no gap between the inserting portion 37 and the receiving surface 75.

The rear portion 72 extends downward from the end portion of the ceiling portion 71. The left and right portions 73 and 74 extend downward from the left and right side portions of the ceiling portion 71. That is, a region surrounded by the mounting surface 41, the receiving surface 75, and the left and right portions 73 and 74 is the insertion groove 70. The gap between the left and right portions 73 and 74 is larger than the width of the inserting portion 37. The position of the inserting portion 37 in the receiver 42 can be adjusted in the left-right direction.

Figure 9:
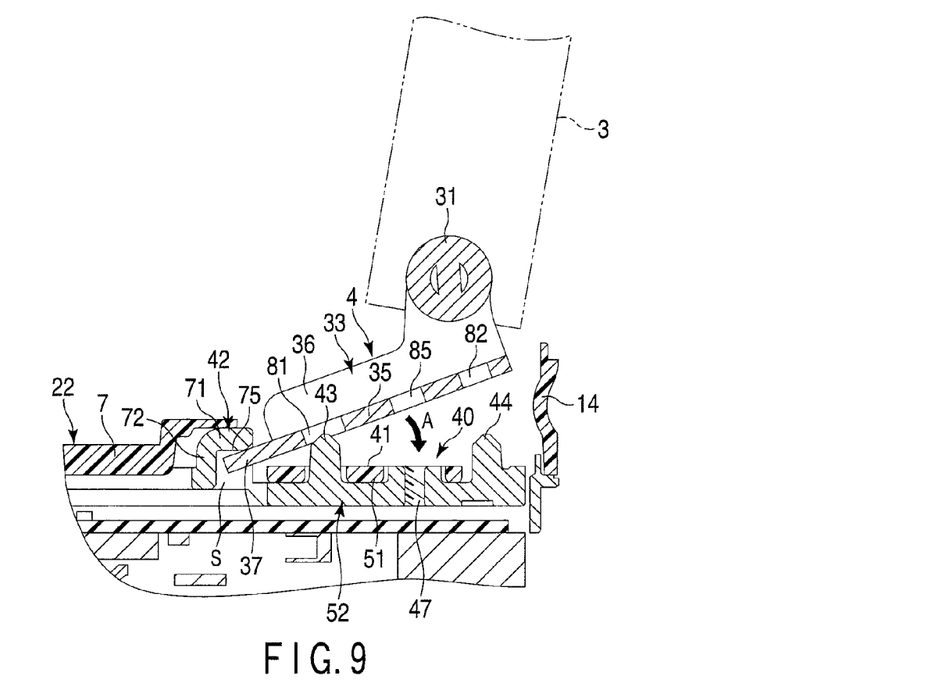
FIG. 9 is an exemplary cross-sectional view illustrating the hinge fixing portion that is being attached to the mounting portion shown in FIG. 8.

As shown in FIG. 8, the wall portion 51 and the reinforcing member 52 are not provided below the receiver 42 and the lower surface of the receiver 42 is opened to the main housing 6. As shown in FIG. 9, a space S to which the inserting portion 37 obliquely inserted into the insertion groove 70 escapes (that is, retreats) is provided below the receiver 42.

As shown in FIGS. 5 and 8, the first and second pins 43 and 44 protrude upward from the mounting surface 41. The first pin 43 passes through the through hole 56 of the wall portion 51 and protrudes upward from the mounting surface 41. The second pin 44 is provided in a region deviating from the wall portion 51 and protrudes upward from the mounting surface 41. The first and second pins 43 and 44 are positioning pins for determining the position of the hinge fixing portion 33. The first and second pins 43 and 44 have conical tops.

The second pin 44 is disposed on the rear side of the first pin 43 in the inserting direction (the direction from the rear wall 14 to the front wall 13) of the inserting portion 37. That is, the receiver 42, the first pin 43, and the second pin 44 are arranged in this order in the direction opposite to the inserting direction.

As shown in FIG. 5, the through hole 45 and the first and second screw holes 46 and 47 are formed in the mounting surface 41. Specifically, the through hole 45 and the first and second screw holes 46 and 47 are formed in the reinforcing member 52 and are exposed to the outside of the mounting portion 40 through the through holes 57, 58, and 59 formed in the wall portion 51.

The layout of the through hole 45 and the screw holes 46 and 47 is not particularly limited. In this embodiment, for example, the second screw hole 47 is provided between the first and second pins 43 and 44. All of the through hole 45 and the first and second screw holes 46 and 47 may be provided on the front side or the rear side of the first and second pins 43 and 44. The through hole 45 communicates with a screw hole (not shown) of a boss provided on the main base 21.

As shown in FIGS. 2 and 10, the main portion 35 of the hinge fixing portion 33 is mounted on the mounting surface 41 of the mounting portion 40. The main portion 35 is supported by the mounting surface 41 from below. The inserting portion 37 is inserted into the insertion groove 70 and comes into contact with the receiving surface 75 from below. The inserting portion 37 is supported by the receiver 42 from the side opposite to the mounting surface 41 (that is, from above). In this way, the first hinge 4 connected to the display unit 3 does not fall backward before it is screwed.

As shown in FIG. 3, the main portion 35 comprises an elongated hole 81, a circular hole 82, and first to third insertion holes 83, 84, and 85. The elongated hole 81 is provided at a position corresponding to the first pin 43, and the first pin 43 engages with the elongated hole 81. For example, the elongated hole 81 includes a pair of arc portions that are away from each other and a substantially straight portion that connects the pair of arc portions. The arc portion may be a semicircle or an arc shorter than the semicircle. The substantially straight portion may be a strict straight line or a line with a small curvature. The elongated hole 81 is formed such that the width thereof in a specific direction (longitudinal direction) is larger than the width thereof in other directions.

The elongated hole 81 is elongated in the inserting direction (that is, the front-rear direction) of the inserting portion 37. When the first pin 43 engages with the elongated hole 81, the position of the hinge fixing portion 33 in the front-rear direction is adjustable, and the movement of the hinge fixing portion 33 in a direction (that is, the left-right direction) orthogonal to the inserting direction of the inserting portion 37 is regulated.

The circular hole 82 is provided at a position corresponding to the second pin 44, and the second pin 44 engages with the circular hole 82. The circular hole 82 has an inside diameter corresponding to the diameter of the second pin 44. When the second pin 44 engages with the circular hole 82, the movement of the hinge fixing portion 33 in the front-rear direction and the left-right direction is regulated.

The first to third insertion holes 83, 84, and 85 are provided so as to correspond to the through hole 45 and the first and second screw holes 46 and 47 and communicate with the through hole 45 and the first and second screw holes 46 and 47, respectively. A first screw 87 passes through the first insertion hole 83 and the through hole 45 and is then engaged with a screw hole (not shown) of the main base 21. First and second screws 88 and 89 pass through the second and third insertion holes 84 and 85 and are then engaged with the first and second screw holes 46 and 47, respectively. In this way, the hinge fixing portion 33 is firmly fixed to the mounting portion 40.

As shown in FIGS. 2 and 3, the hinge fixing portion 33 comprises a pressing portion 91. The pressing portion 91 faces a cable 92 that extends between the display unit 3 and the main unit 2 from above and suppresses the cable 92 from coming off.

Next, the assembly of the electronic apparatus 1 will be described.

The reinforcing members 52 are fixed to the main cover 22 before the first and second hinges 4 and 5 are attached. Specifically, the screw portions 62 are fixed by the screws 64 to position and temporarily fix the reinforcing members 52 to the main cover 22. Then, a jig for welding is used to weld and fix the plurality of welding and fixing portions 63 at the same time. In this way, the reinforcing members 52 are firmly fixed to the main cover 22.

Meanwhile, the hinge bracket 32 is fixed to the display unit 3 to connect the hinge rotating portion 31 and the hinge fixing portion 33 to the display unit 3. Then, the hinge fixing portion 33 is fixed to the mounting portion 40 to connect the display unit 3 to the main unit 2.

Specifically, as shown in FIG. 9, the inserting portion 37 is obliquely inserted into the insertion groove 70 from the upper side. Then, the main portion 35 is put down so as to be substantially parallel to the mounting surface 41 using the inserted inserting portion 37 as a pivot, while rotating the hinge fixing portion 33 (in FIG. 9, movement in the direction of an arrow A). In this process, first, the first pin 43 engages with the elongated hole 81 to temporarily determine the position of the hinge fixing portion 33 in the left-right direction.

Then, the second pin 44 engages with the circular hole 82 to determine the position of the hinge fixing portion 33 in the front-rear direction and the left-right direction. In this case, the inserting portion 37 comes into contact with the receiving surface 75 at the same time as the main portion 35 is mounted on the mounting surface 41, and the inserting portion 37 is supported by the receiver 42 from above.

As shown in FIG. 10, moment M that allows the display unit 3 to fall backward due to the weight of the display unit 3 is applied to the hinge fixing portion 33. However, since the main portion 35 comes into contact with the mounting surface 41 and the inserting portion 37 is supported by the receiver 42 from the upper side, the display unit 3 does not fall. That is, the mounting portion 40 supports the display unit 3 such that the display unit 3 does not fall, without using screws.

For example, the assembler tightens the first screw 87 into the screw hole of the main base 21 through the insertion hole 83 and the through hole 45, without holding the display unit 3 with hands. Then, the assembler tightens the second and third screws 88 and 89 into the screw holes 46 and 47 through the insertion holes 84 and 85, respectively. In this way, the hinge fixing portion 33 is fixed to the mounting portion 40. Then, the hinge cover 94 is attached to the main unit 2.

According to this structure, it is possible to improve the assemblability of the electronic apparatus 1. That is, the inserting portion 37 inserted into the insertion groove 70 and supported by the receiver 42 from the side opposite to the mounting surface 41 makes it possible to support the display unit 3 so as not to fall, without being screwed. Therefore, the assembler can perform a screwing operation without holding the display unit 3 with hands. This structure improves the assemblability of the electronic apparatus 1. In addition, since the first and second pins 43 and 44, the elongated hole 81, and the circular hole 82 are used to perform positioning, the assemblability of the electronic apparatus 1 is further improved.

According to the above-mentioned structure, it is possible to perform an assembly process capable of absorbing the tolerance of each component. That is, the main cover, the hinge, and the display unit each have a dimension error (component tolerance) and an assembly error (assembly tolerance) related to manufacturing. For comparison, an electronic apparatus is considered in which a first hinge bracket extending in the display unit, a second hinge bracket extending in the main unit, and a hinge rotating portion are integrated into a hinge assembly.

In this case, the hinge assembly includes the dimension errors of the first and second hinge brackets and the hinge rotating portion. In addition, the hinge assembly includes assembly errors when the hinge assembly is assembled. When the hinge assembly is connected to the display unit, the dimension error of the hinge assembly is added to the dimension error of the display unit, and an assembly error is additionally involved in the connection. Therefore, a large amount of error is included.

In addition, the main unit has a dimension error. Therefore, when the hinge assembly connected to the display unit is connected to the main unit, the dimension errors of the display unit and the hinge assembly are added to the dimension error of the main unit, and an assembly error is involved in the connection. Therefore, there is a large amount of error in the electronic apparatus.

In order to enclose the errors, the hinge assembly is forcibly fixed to the main unit. In this case, stress is likely to be applied to the fixing portion for fixing the hinge assembly. When the display unit is repeatedly opened and closed, the stress applied to the fixing portion may damage the hinge fixing portion.

Meanwhile, in the structure according to this embodiment, there are the dimension and assembly errors (hereinafter, referred to as the errors of the display unit 3) of the display unit 3 and the hinge bracket 32 between the display unit 3 and the hinges 4 and 5. In addition, there are the dimension and assembly errors (hereinafter, referred to as the errors of the main unit 2) of the main cover 22 and the reinforcing member 52 between the main cover 22 and the reinforcing member 52.

However, in the structure according to this embodiment, one of two positioning holes is the circular hole 82, and the other positioning hole is the elongated hole 81. Therefore, the second pin 44 engaged with the circular hole 82 is a standard for positioning, and the first pin 43 is naturally engaged with the elongated hole 81 at the position to which the errors are reflected. Therefore, the error of the hinge fixing portion 33 in the front-rear direction is reduced.

It is possible to reduce the error of the hinge fixing portion 33 in the left-right direction by rotating the hinge fixing portion 33 on the mounting surface 41 in the left-right direction and utilizing the shape of the elongated hole 81. That is, before the second pin 44 engages with to the circular hole 82, the hinge fixing portion 33 can be slightly inclined in the left-right direction to adjust the position of the hinge fixing portion 33 with respect to the first pin 43 according to the shape of the elongated hole 81. In this way, it is possible to adjust the position of the circular hole 82 with respect to the second pin 44 without applying a load to the elongated hole 81 and the first pin 43. Therefore, it is possible to naturally fit the second pin 44 to the circular hole 82. As a result, the error of the hinge fixing portion 33 in the left-right direction is reduced.

That is, in this embodiment, it is possible to absorb the error of the display unit 3 and the error of the main unit 2 between the hinge fixing portion 33 and the mounting portion 40. Therefore, the error which is to be enclosed in the hinge fixing portion 33 is reduced. As a result, little stress is applied to the hinge fixing portion 33, and the reliability of the electronic apparatus 1 is improved.

As shown in FIG. 9, when the inclined hinge fixing portion 33 is rotated toward the mounting surface 41, the elongated hole 81 elongated in the inserting direction of the inserting portion 37 is less likely to come into contact with the first pin 43 than the circular hole. Therefore, it is possible to smoothly attach the hinge fixing portion 33.

When the receiver 42 deviates from the upper area of the mounting surface 41 and the space S to which the inserting portion 37 escapes is provided below the receiver 42, it is possible to obliquely insert the inserting portion 37 into the insertion groove 70 and rotate the inserted hinge fixing portion 33 to the mounting surface 41. This structure improves the attachment of the hinge fixing portion 33.

According to the structure in which the first and second pins 43 and 44 have conic tips, when the inclined hinge fixing portion 33 is rotated to the mounting surface 41, the hinge fixing portion 33 is less likely to come into contact with the first and second pins 43 and 44. Therefore, the attachment of the hinge fixing portion 33 is improved.

The receiver 42 may be provided in the main housing 6 made of a synthetic resin. When the receiver 42 is provided in the metal reinforcing member 52, it is possible to form the receiver 42 with a relatively small size to which a relatively strong force or moment is applied, while maintaining the strength. This contributes to reducing the size and thickness of the electronic apparatus 1.

The screw holes 46 and 47 may be provided in the main housing 6 made of a synthetic resin. When the screw holes 46 and 47 are provided in the metal reinforcing member, it is easy to ensure the strength of the screw holes 46 and 47 to which a relatively strong force is applied.

The second pin 44 is not an indispensable component. When the second pin 44 engaged with the circular hole 82 is provided, it is possible to more accurately position the hinge fixing portion 33, as compared to when only the first pin 43 engaged with the elongated hole 81 is provided.

The second pin 44 is arranged on the rear side of the first pin 43 in the inserting direction of the inserting portion 37. In this case, when the hinge fixing portion 33 is rotated and attached, it is possible to make the elongated hole 81 correspond to the first pin 43 engaged at a relatively large angle and to make the circular hole 82 correspond to the second pin 44 engaged at a relatively small angle. Therefore, it is possible to smoothly fit the second pin 44 to the circular hole 82.

When the main housing 6 forms at least a part of the mounting surface 41 and comprises the wall portion 51 interposed between the reinforcing member 52 and the main portion 35, the main housing 6 is reinforced by the wall portion 51. Therefore, it is not necessary to provide an additional reinforcing portion in the main housing 6. When the reinforcing member 52 comprises the supporting portion 66 that supports the wall portion 51 from below and the convex portion 67 that is higher than the supporting portion 66 and forms a part of the mounting surface 41, the convex portion 67 functions as a beam. Therefore, it is possible to increase the strength of the reinforcing member 52.

For comparison, an electronic apparatus is considered in which a hinge bracket, which is a portion of the hinge assembly, is attached to the main unit. In the electronic apparatus, the hinge bracket connected to the display unit 3 is inserted into the opening of the main housing and is fixed. Therefore, the display unit is an obstacle to welding and fixation and makes it difficult to weld and fix the hinge bracket. In addition, the size or shape of the hinge bracket is limited by the size of the opening of the main housing.

In the structure according to this embodiment, the first and second hinges 4 and 5 can be disassembled from the main unit 2. Therefore, it is possible to fix the reinforcing member 52 to the inner surface of the main cover 22 independently from the attachment of the first and second hinges 4 and 5. Therefore, it is possible to weld and fix the reinforcing member 52 and the size or shape thereof is hardly limited. The welding and fixation process makes it easy to reduce costs and the number of processes, as compared to a screwing process.

Second Embodiment

Figure 11:
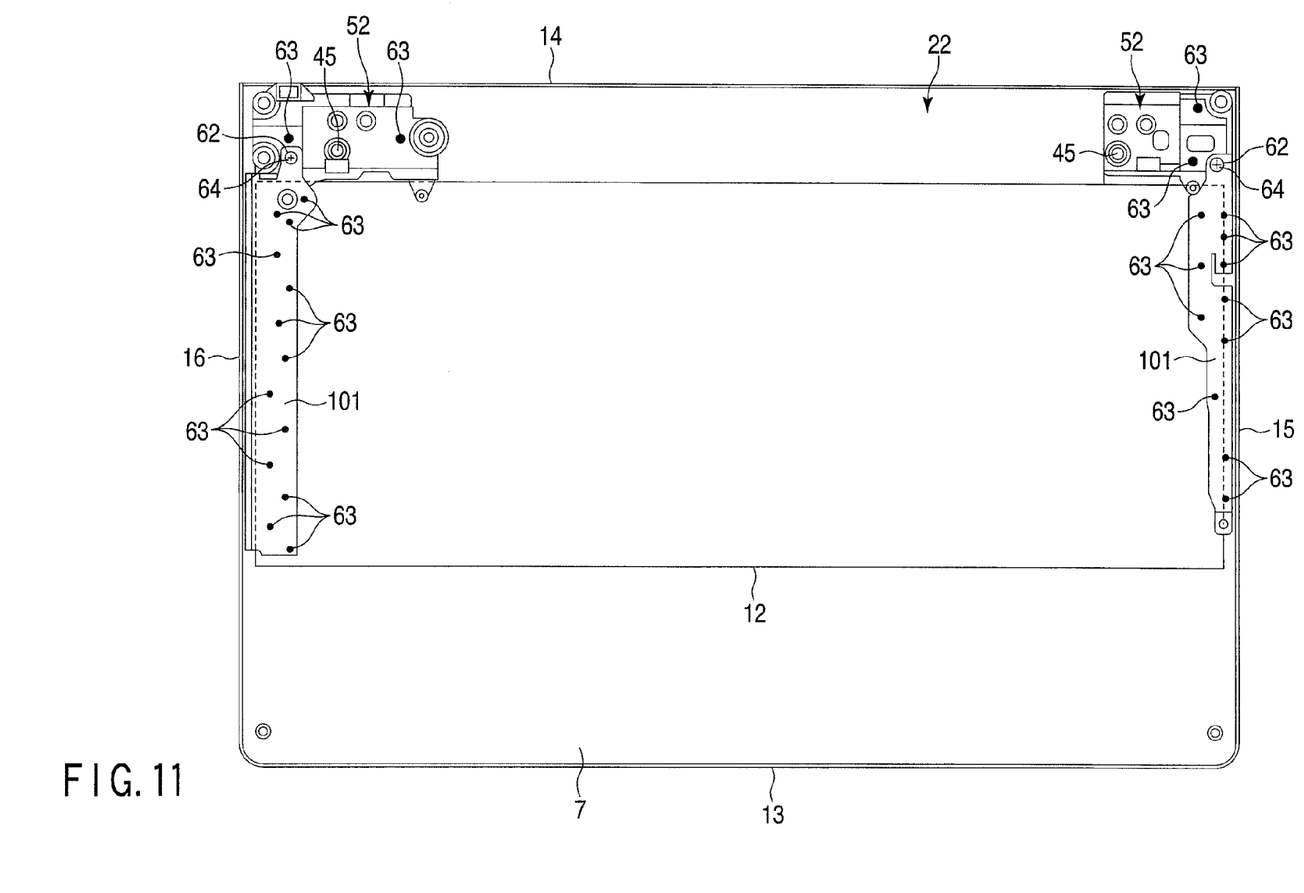
FIG. 11 is an exemplary plan view illustrating the inner surface of a main cover of an electronic apparatus according to a second embodiment.

Next, an electronic apparatus 1 according to a second embodiment will be described with reference to FIG. 11. In the second embodiment, components having the same or similar functions as those in the first embodiment are denoted by the same reference numerals and a description thereof will be omitted. The second embodiment is similar to the first embodiment except for the following structure.

The electronic apparatus 1 according to this embodiment comprises a relatively large keyboard 11 including a ten-key (i.e., a numerical keypad). Therefore, as shown in FIG. 11, the electronic apparatus 1 comprises a keyboard mounting portion 12 with a width close to the overall width of the main cover 22. The size of the reinforcing member 52 is smaller than that in the first embodiment, and is provided on the rear side of the keyboard mounting portion 12.

A metal sheet 101 for reinforcement is connected to the reinforcing member 52. The keyboard mounting portion 12 is recessed to the main housing 6. The metal sheet 101 is formed with a thickness smaller than that of the reinforcing member 52 so as to correspond to the recess of the keyboard mounting portion 12. The metal sheet 101 is attached to the lower side of the keyboard mounting portion 12 along the side end portion of the main cover 22. The metal sheet 101 reinforces the keyboard mounting portion 12.

According to the above-mentioned structure, similar to the first embodiment, it is possible to improve the assemblability of the electronic apparatus 1. According to the above-mentioned structure, the shapes of the reinforcing member 52 and the main cover 22 of the electronic apparatus 1 according to this embodiment are different from those of the electronic apparatus 1 according to the first embodiment, but the electronic apparatuses 1 according to the first and second embodiments have other common parts. According to the electronic apparatus 1, it is possible to relatively simplify customization such as of the type of the keyboard 11.

The electronic apparatuses 1 according to the first and second embodiments have been described above, but the invention is not limited thereto. The components according to the first and second embodiments may be appropriately combined with each other. The invention is not limited to the above-described embodiments, but various modifications and changes of the invention can be made without departing from the scope and spirit of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic apparatus comprising:
   a first housing comprising a wall, the wall comprising a mounting surface and a hole;
   a second housing;
   a metal reinforcing member in the first housing, the reinforcing member comprising a first pin, a supporting portion, and a receiver, the first pin inserted into the hole of the wall and protruding from the wall, the supporting portion facing the wall in a protruding direction of the first pin and configured to support the wall, the receiver comprising an insertion groove; and
   a fixing portion attached to the second housing and comprising an inserting portion, and a main portion which comprises an elongated hole,
   the inserting portion configured to be inserted into the insertion groove in a state where the fixing portion is in an inclined posture with respect to the first pin, and to be supported by the receiver from a side opposite to the wall,
   the elongated hole elongated in an inserting direction of the inserting portion and configured to engage with the first pin in the state where the fixing portion is in the inclined posture,
   the main portion configured to be rotated toward the wall from a position where the fixing portion is in the inclined posture, with the first pin being in the elongated hole, and to be on the wall from a side opposite to the supporting portion.

2. The electronic apparatus of claim 1, wherein the wall is made of synthetic resin.

3. The electronic apparatus of claim 1, wherein the reinforcing member comprises a protrusion deviating from the wall, the protrusion protruding from the supporting portion toward the main portion of the fixing portion so that a top surface of the protrusion is positioned on substantially the same plane as a top surface of the wall and forms a part of a plane on which the main portion of the fixing portion is mounted.

4. The electronic apparatus of claim 3, wherein an end of the protrusion extends in parallel with the wall.

5. The electronic apparatus of claim 1, wherein
   the wall comprises an insertion hole, and
   the supporting portion comprises a screw hole communicating with the insertion hole, and the supporting portion is fixed by a screw which passes through the insertion hole and engages with the screw hole.

6. The electronic apparatus of claim 1, wherein
   the receiver deviates from an upper area of the wall, and
   the insertion groove is opened on a lower side, and an end of the inserting portion is configured to be inserted lower than a top surface of the wall in the state where the fixing portion is in the inclined posture.

7. The electronic apparatus of claim 1, wherein
   the reinforcing member comprises a second pin in parallel with the first pin, the main portion of the fixing portion comprises a circular hole configured to engage with the second pin, and
   the first pin is configured to be moveable with respect to the elongated hole when the second pin engages with the circular hole.

8. The electronic apparatus of claim 7, wherein the second pin is located on a rear side of the first pin in the inserting direction of the inserting portion.

9. An electronic apparatus comprising:
   a first housing comprising a wall;
   a second housing;
   a metal reinforcing member comprising a supporting portion in the first housing;
   a mounting portion comprising the wall, the supporting portion, a first pin protruding from the wall, and a receiver, the receiver comprising an insertion groove; and
   a fixing portion attached to the second housing and comprising an inserting portion, and a main portion which comprises an elongated hole,
   the inserting portion configured to be inserted into the insertion groove in a state where the fixing portion is in an inclined posture with respect to the first pin, and to be supported by the receiver from a side opposite to the wall,
   the elongated hole elongated in an inserting direction of the inserting portion and configured to engage with the first pin in the state where the fixing portion is in the inclined posture,
   the main portion configured to be rotated toward the wall from a position where the fixing portion is in the inclined posture, with the first pin being in the elongated hole, and to be on the wall,
   wherein the wall is interposed between the supporting portion of the reinforcing member and the main portion of the fixing portion in a thickness direction of the first housing.

10. The electronic apparatus of claim 9, wherein the wall is interposed between the supporting portion of the reinforcing member and the main portion of the fixing portion in a projecting direction of the first pin.

11. The electronic apparatus of claim 9, wherein the wall is made of synthetic resin.

12. The electronic apparatus of claim 9, wherein the reinforcing member comprises a protrusion deviating from the wall, the protrusion protruding from the supporting portion toward the main portion of the fixing portion so that a top surface of the protrusion is positioned on substantially the same plane as a top surface of the wall and forms a part of a plane on which the main portion of the fixing portion is mounted.

13. The electronic apparatus of claim 9, wherein
   the receiver deviates from an upper area of the mounting surface, and the insertion groove is opened on a lower side, and an end of the inserting portion is configured to be inserted lower than a top surface of the wall in a state where the fixing portion is in the inclined posture.

14. An electronic apparatus comprising:
a first housing comprising a wall;
a second housing;
a metal reinforcing member comprising a supporting portion in the first housing;
a mounting portion comprising the wall, the supporting portion, a first pin protruding from the wall, and a receiver, the receiver comprising an insertion groove; and
a fixing portion attached to the second housing and comprising an inserting portion, a main portion which comprises an elongated hole,
the inserting portion configured to be inserted into the insertion groove in a state where the fixing portion is in an inclined posture with respect to the first pin, and to be supported by the receiver from a side opposite to the wall,
the elongated hole elongated in an inserting direction of the inserting portion and configure to engage with the first pin in the state where the fixing portion is in the inclined posture,
the main portion configured to be rotated toward the wall from a position where the fixing portion is in the inclined posture, with the first pin being in the elongated hole and to be on the wall.

15. The electronic apparatus of claim 14, wherein
the reinforcing member comprises a protrusion deviating from the wall, the protrusion protruding from the supporting portion toward the main portion of the fixing portion,
a part of the main portion of the fixing portion is mounted on the protrusion.

16. The electronic apparatus of claim 14, wherein
the reinforcing member comprises a protrusion deviating from the wall, the protrusion protruding from the supporting portion toward the main portion of the fixing portion,
an end of the protrusion extends in parallel with the wall.

* * * * *